(12) United States Patent  Koren et al.

(10) Patent No.: US 10,497,092 B2
(45) Date of Patent: Dec. 3, 2019

(54) CONTINUOUS LIGHT INSPECTION

(71) Applicant: CAMTEK LTD, Migdal Ha'emek (IL)

(72) Inventors: Shimon Koren, Haifa (IL); Menachem Regensburger, Shimshit (IL); Zehava Ben-Ezer, Balfuria (IL)

(73) Assignee: CAMTEK LTD, Migdal Haemeq (IL)

( * ) Notice: Subject to any disclaimer, the term of this patent is extended or adjusted under 35 U.S.C. 154(b) by 44 days.

(21) Appl. No.: 15/347,013

(22) Filed: Nov. 9, 2016

(65) Prior Publication Data

US 2017/0150104 A1    May 25, 2017

Related U.S. Application Data

(60) Provisional application No. 62/257,245, filed on Nov. 19, 2015.

(51) Int. Cl.
| | |
|---|---|
| *G06F 19/00* | (2018.01) |
| *G06T 3/00* | (2006.01) |
| *H04N 5/225* | (2006.01) |
| *H01L 21/66* | (2006.01) |

(52) U.S. Cl.
CPC .......... *G06T 3/0068* (2013.01); *H01L 22/00* (2013.01); *H04N 5/2256* (2013.01)

(58) Field of Classification Search
CPC ...... G06T 3/0068; H01L 22/00; H04N 5/2256
See application file for complete search history.

(56) References Cited

U.S. PATENT DOCUMENTS

| | | | | |
|---|---|---|---|---|
| 7,729,528 | B2* | 6/2010 | O'Dell | G01N 21/9501 250/559.39 |
| 2004/0046102 | A1* | 3/2004 | Horiuchi | G02B 7/38 250/201.2 |
| 2004/0262539 | A1* | 12/2004 | Yui | H01J 37/065 250/492.1 |
| 2005/0110988 | A1* | 5/2005 | Nishiyama | G01N 21/95684 356/237.5 |
| 2005/0162178 | A1* | 7/2005 | Steele | G01N 27/002 324/750.22 |
| 2006/0012780 | A1* | 1/2006 | Nishiyama | G01N 21/95 356/237.4 |
| 2007/0023653 | A1* | 2/2007 | Toyoda | G06T 7/0006 250/310 |
| 2007/0178727 | A1* | 8/2007 | Igarashi | G01R 1/07314 439/91 |
| 2007/0273945 | A1* | 11/2007 | Furman | G01N 21/8806 359/107 |

(Continued)

*Primary Examiner* — Howard D Brown, Jr.
(74) *Attorney, Agent, or Firm* — Reches Patents

(57) ABSTRACT

An inspection system that may include a motion device, for supporting an inspected object and for moving the inspected object, in response to motion device triggering signals, by a movement that is characterized by speed variations; a signal generator, for generating camera triggering signals and motion device location triggering signals; a motion device location generator, for providing location information indicative of locations of the stage at points of time that are determined by the motion device location triggering signals; a continuous illuminator for continuously illuminating areas of the inspected object; and a camera for acquiring images of areas of the inspected object in response to the camera triggering signals.

22 Claims, 11 Drawing Sheets

(56) References Cited

U.S. PATENT DOCUMENTS

| | | | |
|---|---|---|---|
| 2010/0171947 A1* | 7/2010 | Yoshino | G01N 21/93 356/237.5 |
| 2010/0198389 A1* | 8/2010 | Schulze | G06T 7/0006 700/110 |
| 2011/0299104 A1* | 12/2011 | Seo | G01J 3/02 358/1.9 |
| 2014/0169657 A1* | 6/2014 | Harada | G01N 21/956 382/145 |
| 2016/0150191 A1* | 5/2016 | Karsenti | H04N 7/181 382/149 |

\* cited by examiner

CONTINUOUS LIGHT INSPECTION

CROSS REFERENCE TO RELATED APPLICATIONS

This application claims priority of U.S. provisional patent Ser. No. 62/257,245 and filing date Nov. 19, 2015, which is incorporated herein by reference.

BACKGROUND OF THE INVENTION

Every system is composed of some components that interact together in order to achieve a designated target, and an inspection machine is no different. Inspection machines move and take images of wafers. In particular, the imaging process requires a sequence of activities that achieve an imaging of the entire wafer, at the minimum amount of time. The ability to achieve the required purpose, each component should work within given constraints.

As the constraints mount, the complexity of the system will rise. This in turn will increase cost (development, integration and maintenance), and the reliability will be reduced. In contrast, a "loosely bounded" system enables a more cost effective and reliable solution while keeping the end result within the required boundaries.

The Imaging Module

Every AOI system must acquire an image of the wafer for the inspection process. This, of course requires an imaging component which includes a camera (with an appropriate optics), coupled to a light source that can acquire an image. To control the camera, the system requires a frame grabber that will transfer the data to a Computer for later processing.

As the defect resolution seldom permits a single shot for the whole wafer, a motion component is coupled to the imaging component that enables taking images in different locations on the wafer. The Motion Component includes a Motion Device that enables the movement and a Motion controller that activated the Motion device appropriately.

The goal for this Imaging module is to have an image of the whole wafer. As this image is too big to be taken in a single shot, it has to be broken into multiple frames. These frames should:

a. Meet optical requirement.
b. Cover the whole wafer area.
c. Be associated to the right locations on the wafer.

Continuous Scan

In order to achieve a good performance for the wafer acquisition, the system grabs the image while in movement. That, of course, influences the image quality (smearing). In order to limit the smearing effect, the actual grabbing is done in a short (time) interval. As the user requires a specific position, the traditional sequence is:

a. Camera Shutter opens.
b. Motion controller reaches position (while moving).
c. A short burst of light is generated.
d. Camera Shutter Closes This sequence requires a tight coupling between the different components and inherent problems that accompany it. Moreover, as the position is governed by the Motion controller—the speed cannot be accurate and the time between two consecutive images is not accurate. This prevents the system from using the full frame rate of the camera (when the rate exceeds the maximum frame rate—an image will be lost).

SUMMARY

There may be provided an inspection system, comprising: a motion device, for supporting an inspected object and for moving the inspected object, in response to motion device triggering signals, by a movement that may be characterized by speed variations; a signal generator, for generating camera triggering signals and motion device location triggering signals; a motion device location generator, for providing location information indicative of locations of the stage at points of time that may be determined by the motion device location triggering signals; a continuous illuminator for continuously illuminating areas of the inspected object; and a camera for acquiring images of areas of the inspected object in response to the camera triggering signals.

The signal generator may be configured to generate the camera triggering signals and the motion device location triggering signals at a fixed frequency regardless of the speed variations.

The signal generator may be configured to generate at the fixed frequency the motion device triggering signals.

For simplicity of explanation some of the example refer to the signal generator as generating the motion device triggering signals—but this is merely a non-limiting example. The same applied to a method that include generating the motion device triggering signals.

The signal generator may be configured to generate the camera triggering signals and the motion device location triggering signals in response to timing constraints that include timing differences between propagation periods of the camera triggering signals and the motion device location triggering signals.

The stage may be configured to reverse a direction of movement of the inspected object by a gradual change of direction of movement along each axis out of two axes.

The motion device may be configured to move the inspected object according to a curved pattern.

The motion device may be configured to move the inspected object without stopping a movement of the inspected object according to a hybrid pattern that comprises linear portions and curved portions.

The overlaps between the images of the areas of the inspected object may be characterized by overlap variations; and the processor may be configured to compensate for the overlap variations.

The image processor may be configured to generate an image of a region that includes two or more areas of the inspected object; the generating of the image of the region may be responsive to location information indicative of locations of the stage at points of time that correspond to an acquisition of images of the two or more areas.

The continuous illuminator may be configured to continuously illuminate areas of the inspected object with a continuous light beam of a varying intensity.

The continuous illuminator may be configured to increase an intensity of the continuous light beam before a beginning of an image acquisition period during which the camera acquired an image and to decrease the intensity of the continuous light beam after an end of the image acquisition period.

The signal generator may be configured to generate, continuous illuminator triggering signals; and the continuous illuminator may be configured to change the intensity of the continuous light beam in response to the continuous illuminator triggering signals.

A method may be provided and may include supporting, by a motion device, an inspected object and moving the inspected object, in response to motion device triggering signals, by a movement that may be characterized by speed variations; generating by a signal generator camera triggering signals and motion device location triggering signals;

providing, by a motion device location generator, location information indicative of locations of the stage at points of time that may be determined by the motion device location triggering signals; continuously illuminating, by a continuous illuminator, areas of the inspected object; and acquiring, by a camera, images of areas of the inspected object in response to the camera triggering signals.

The method may include generating the camera triggering signals and the motion device location triggering signals at a fixed frequency regardless of the speed variations.

The method may include generating at the fixed frequency the motion device triggering signals.

The method may include generating the camera triggering signals and the motion device location triggering signals in response to timing constraints that include timing differences between propagation periods of the camera triggering signals and the motion device location triggering signals.

The method may include reversing a direction of movement of the inspected object by a gradual change of direction of movement along each axis out of two axes.

The method may include moving the inspected object according to a curved pattern.

The method may include moving the inspected object without stopping a movement of the inspected object according to a hybrid pattern that comprises linear portions and curved portions.

Overlaps between the images of the areas of the inspected object may be characterized by overlap variations; and the method comprises compensating by the image processor for the overlap variations.

The method may include generating, by the image processor, an image of a region that includes two or more areas of the inspected object; the generating of the image of the region may be responsive to location information indicative of locations of the stage at points of time that correspond to an acquisition of images of the two or more areas.

The method may include continuously illuminating areas of the inspected object with a continuous light beam of a varying intensity.

The method may include increasing an intensity of the continuous light beam before a beginning of an image acquisition period during which the camera acquired an image and decreasing the intensity of the continuous light beam after an end of the image acquisition period.

The method may include generating continuous illuminator triggering signals; and changing the intensity of the continuous light beam in response to the continuous illuminator triggering signals.

BRIEF DESCRIPTION OF THE INVENTION

The present invention will be understood and appreciated more fully from the following detailed description taken in conjunction with the drawings in which.

DETAILED DESCRIPTION OF THE INVENTION

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the following specification, the invention will be described with reference to specific examples of embodiments of the invention. It will, however, be evident that various modifications and changes may be made therein without departing from the broader spirit and scope of the invention as set forth in the appended claims.

The same reference numbers may be used, in different figures, to refer to the same elements or to different elements.

There may be provided an inspection system that may include:
  a. A motion device, for supporting an inspected object and for moving the inspected object by a movement that is characterized by speed variations. These speed variations may represent wanted speed variations (for Example—due to a wanted acceleration of the motion device) and/or unwanted speed variations (due to inaccuracies or an imperfection of the movements). The motion device may be a mechanical stage that may include a XYZ-stage, a rotation stage, an XY stage, and the like.
  b. A signal generator, for generating at a fixed frequency regardless of the speed variations, camera triggering signals, frame grabber triggering signals and motion device location triggering signals. The signal generator may be any known hardware signal generator that is capable of generating electrical signals.
  c. A motion device location generator, for providing location information indicative of a location of the motion device at points of time that are determined by the motion device location triggering signals. The motion device location generator may be a decoder that uses illumination and reflection to determine the location of the motion device.
  d. A continuous illuminator (continuous light source) for continuously illuminating areas of the inspected object.
  e. A camera for acquiring images of areas of the inspected object in response to the camera triggering signals.

Figure 1:
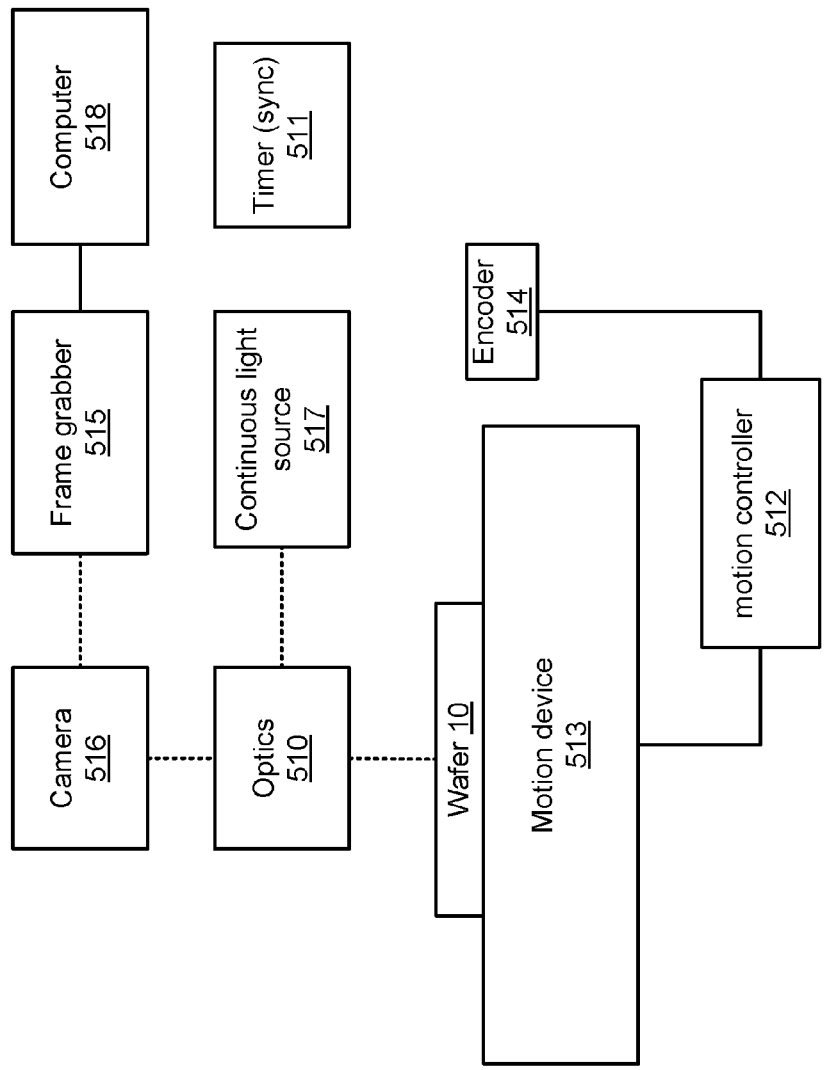
FIG. 1 illustrates a system according to an embodiment of the invention.
Figure 2:
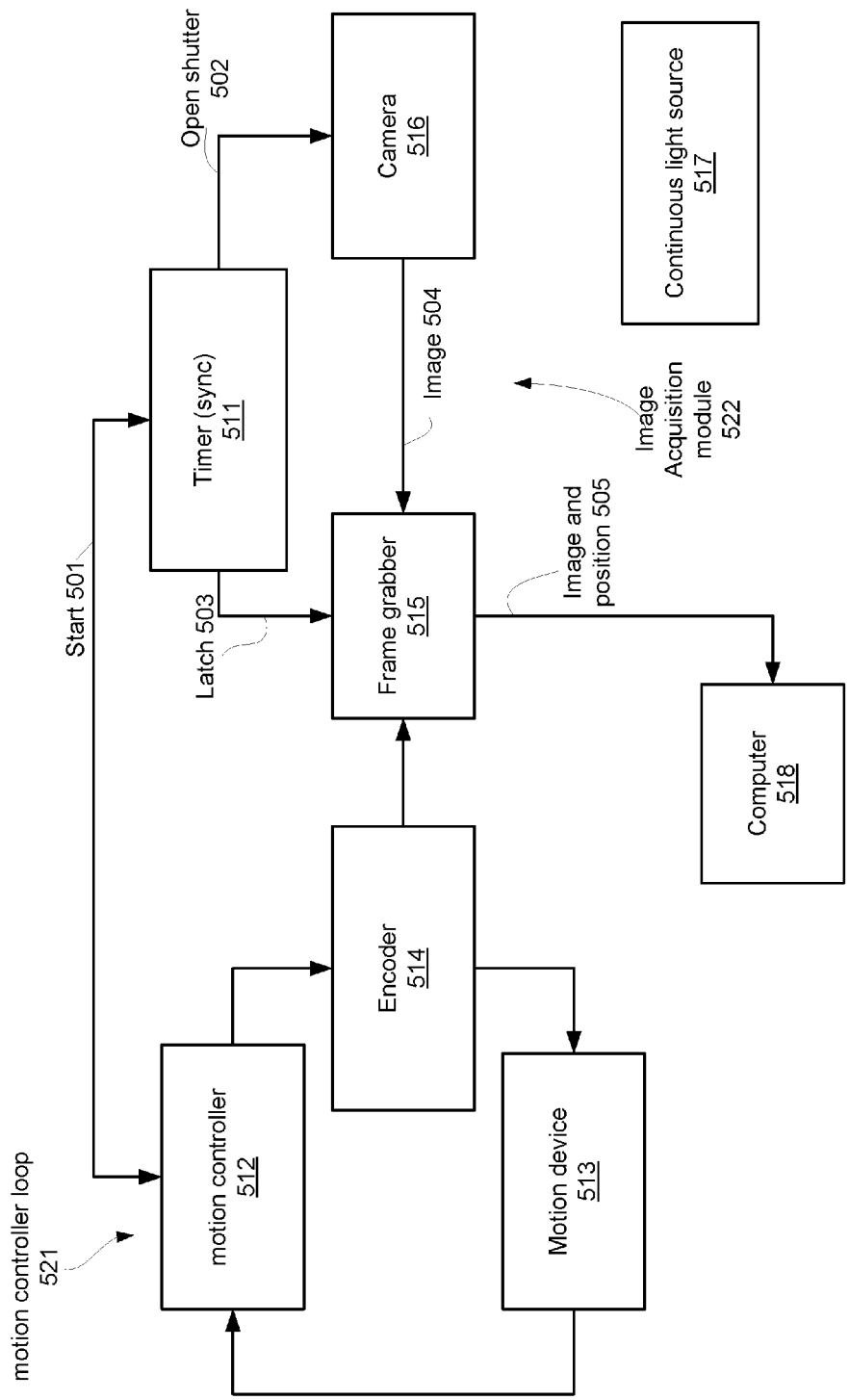
FIG. 2 illustrates various components of the system as different control signals according to an embodiment of the invention.
Figure 4:
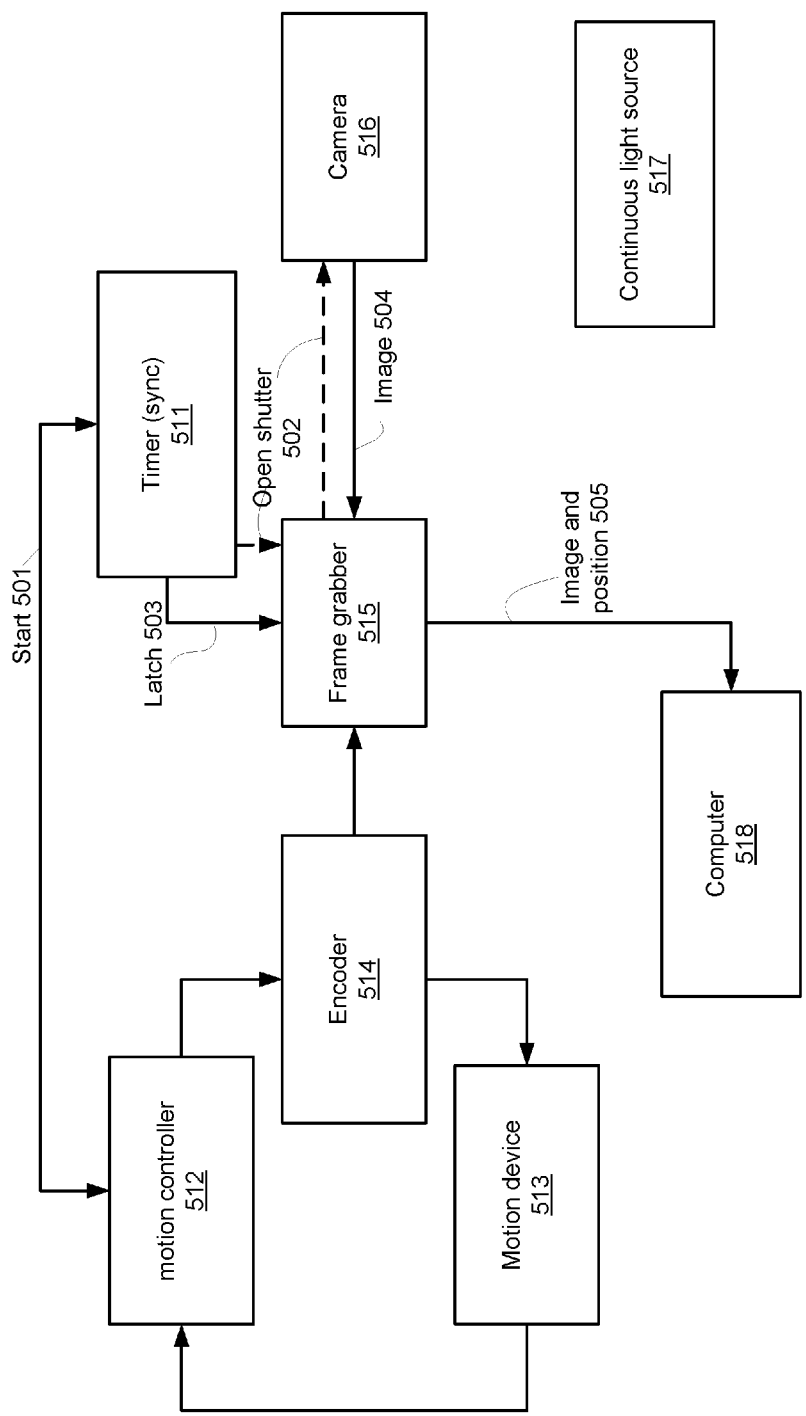
FIG. 4 illustrates various components of the system as different control signals according to an embodiment of the invention.

The signal generator may be a sync card (synchronization card) or a timer—as illustrated in FIGS. 1,2 and 4.

The motion device location generator may be an encoder—as illustrated in FIGS. 1,2 and 4.

The camera triggering signals, motion device triggering signals and motion device location triggering signals may be commands, pulses or have any other format. In FIGS. 1-6 these figures are referred to as open shutter, start and latch commands.

There is provided a system and method for a "loosely bounded" imaging module of an inspection machine. The reduced the dependency between the different components of this module results in ability to use cheaper and more reliable technologies, while keeping the model cheaper and as a whole, more robust. In addition, this configuration eases the integration process and so saves labor and loss.

U.S. Pat. No. 8,290,243, which is incorporated herein by reference in its entirety, describes a free run pulsed illumination configuration in which the motion component is required to move at speed that will not create "holes" between two consecutive frames. The camera and the pulsed light source are operated based on the time. This enables the system to utilize the full frame rate of the system—as the grabbing is based on time, while improving the position data accuracy by direct measurement of the position.

This solution, albeit its clear advantages, still keeps high demands from the illumination component. As strobe lights usually use discharge, this is prone to instability and short lifetime. The intensity of the pulse changed in a non-linear manner over time (see curve 661 of FIG. 6), the delay between a triggering signal to the generation of the pulse is unpredictable (anywhere within a time window that corresponds to possible effective image location 662) and the illumination intensity may change from one image to another in a non-predictable manner. The non-linearity change of intensity will also introduce differences in the intensity of the illumination that are responsive to the direction of the scan of the object.

There is provided a system and method for continuous free run scanning of an object. The object may be a wafer—but this is just a non-limiting example of an object.

This approach utilizes the free run approach with a high intensity illumination and an accurate (very) short global shutter of the camera. This concept completely decouples the light source from the acquisition sequence as it stays on at all times (or at least on during a scan of the object—for example when the object is mechanically scanned by a motion device that follows a scan pattern that includes idle periods—periods in which motions is introduced by the motion device but no images should be acquired—for example the literal scan between rows—the light source can or cannot be turned off).

Figure 7:
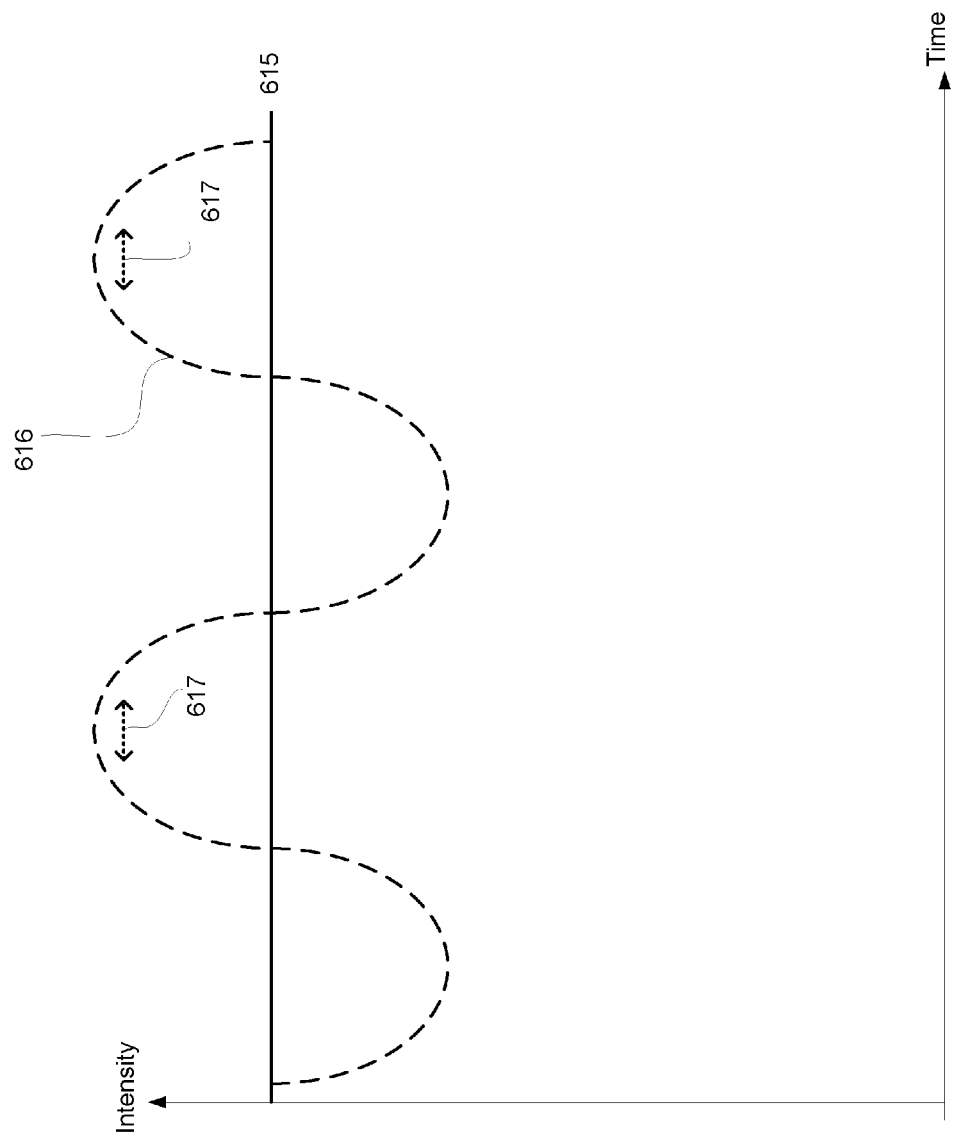
FIG. 7 illustrates a constant illumination profile during an image acquisition period according to an embodiment of the invention.

This approach besides its simplified motion controller mechanism, simple acquisition sequence and simple illumination, resulting in higher reliability of the system as a whole, has a superior position accuracy (as it is measures directly) and better (and cheaper) illumination stability. See FIG. 7—a constant illumination intensity (curve 615) is obtained regardless of the exact timing of the image acquisition and regardless of the direction of scanning.

Referring to FIGS. 1, 2 and 4—the inspection system includes:
a. Timer 511. The time is also referred to as a signal generator, a sync card and a synchronization unit.
b. Motion controller 512.
c. Motion device 513 (such as but not limited to a chuck and mechanical stage—especially a XYZ mechanical stage).
d. Encoder 514.
e. Frame grabber 515.
f. Camera 516.
g. Continuous light source 517. The continuous light source may continuously illuminate the object with a continuous light beam that may have a fixed intensity or may have a varying intensity. The intensity may vary in periodical manner or in any other manner so that the intensity of the continuous light beam may be lower when the camera is not expected to acquire an image (for example—closed shutter) and may be stronger when the camera is expected be open (for example—open shutter). The intensity may change in various manners—in a gradual manner, in a non-gradual manner, in a linear manner, in a non-linear manner. The increase of intensity may occur before the camera is expected to be open (for example few microns before the shutter should be opened) or simultaneously with the opening of the shutter, and the like. The change of intensity may be equal to a constant plus sinus(t)*sinus (t), wherein t represents time and the constant is large enough so that the continuous light source is not shut does when sinus(t) equals zero. The change of intensity may also equal sinus(t)+constant (see curve 616 of FIG. 7), wherein the constant exceeds minus one. When operating in a periodical manner the change of intensity may be triggered by timer 511 (of FIG. 4) and/or by frame grabber 515 and/or by camera 516. An intensity peak signal or any other signal that initiates a change in the intensity may be driven from open shutter signal 502, may precede the open shutter signal 502 or may be generated in any timing that will guarantee that the increase of light intensity occurs when the camera is open (see arrows 617 of FIG. 7) and a decrease in intensity occurs after the camera is closed. The varying intensity may reduce power consumption and may reduce the heating of the object due to illumination. The change of intensity does not require the continuous light source 517 to be turned on an off.
h. Computer 518. The computer 518 may be a processor (such as an image processor) for processing the images acquired by the camera and performing any process such as a defect detection, verification, review or metrology process.
i. Optics 510 (shown only in FIG. 1). Optics 510 may include lenses, beam shapers, beam splitters, mirrors, scanners, filters, polarizer, magnifiers, telescopes, relay units, and the like. Optics 510 receives a continuous light beam from continuous light source 517 and continuously illuminates the wafer 10 with an impinging light beam. Optics 510 also receives a reflected and/or scattered beam from the wafer and provides a collected light beam to camera 516.

FIG. 1 also shown an object such as wafer 10 that is supported by motion device 513.

The optics 510 and motion device 513 may be, for example, the optics, chuck and motion device of an inspection system such as but not limited to the Eagle AP or the Eagle I of Camtek Ltd. of Israel.

FIG. 2 illustrates that the motion controller 512, encoder 514 and motion device 513 form a motion control loop 521. FIG. 2 also illustrates that camera 516 and frame grabber 515 form an image acquisition module 522.

Motion controller 512 is coupled motion device 513 and control the movement of the motion device 513.

Encoder 514 monitors the location (movements) of the motion device 513.

Encoder data is sent both to frame grabber 515 and to motion controller 512.

Frame grabber 515 has an internal encoder accumulator that enables it to have a constant accurate location of motion device 513.

The data for the movement of the motion device 513 over the whole wafer is sent during the pre-scanning stage to the motion controller 512. However, the movement will not start before a start pulse arrives from the timer 511.

As the start pulse 501 arrives the motion device 513 starts the predefined movement.

In FIG. 2 the timer 511 (such as a sync card) continuously sends the open shutter command 502 and a latch command 503 to the frame grabber 515 at pre-programmed rate. The camera receives the open shutter command 502 from the frame grabber 515 (especially from a CXP interface or any other interface of the frame grabber).

Figure 3:
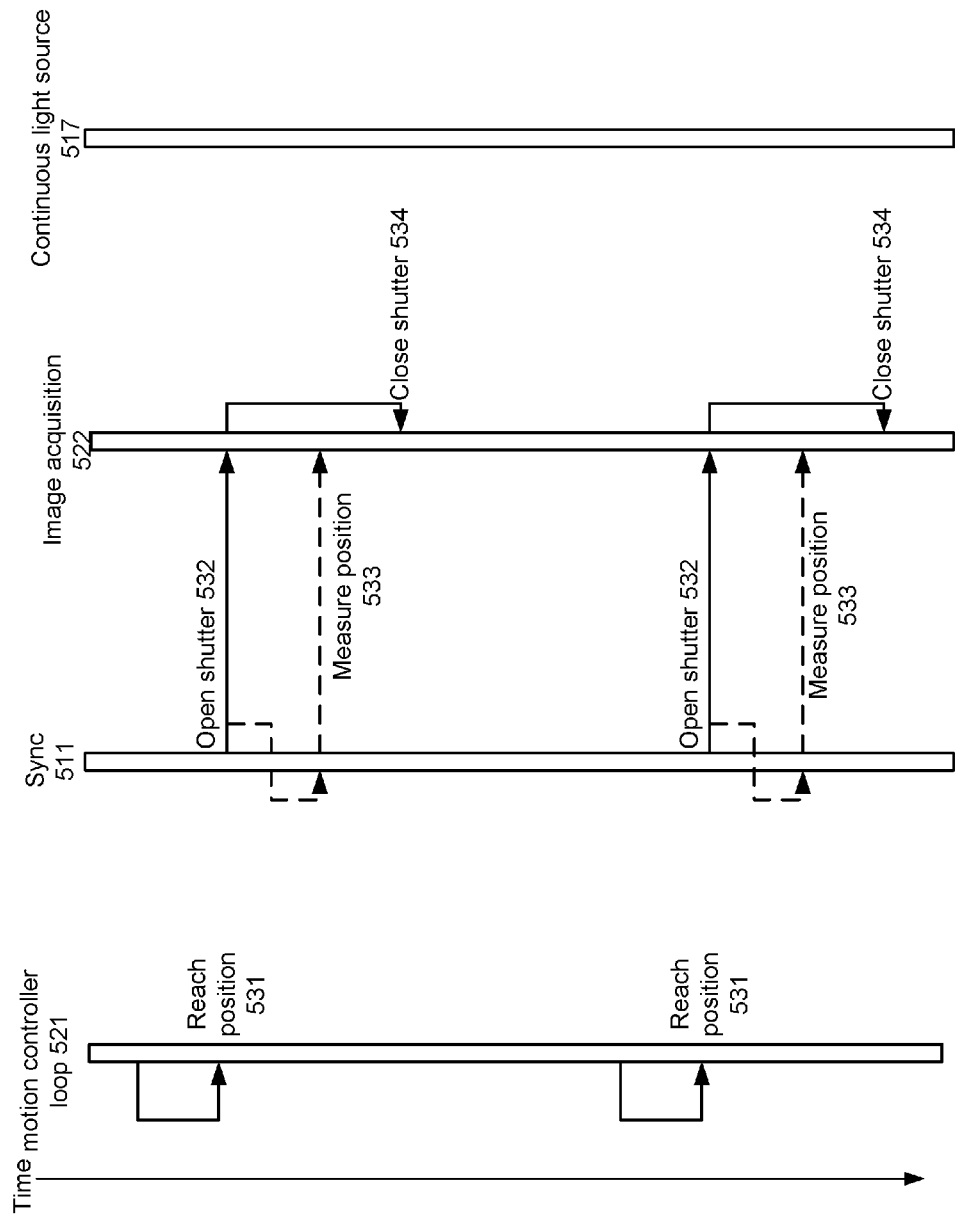
FIG. 3 is a timing diagram according to an embodiment of the invention.

In FIG. 3 the open shutter command 502 is sent to camera 516—without passing through frame grabber 515.

The open shutter command 502 triggers a "start exposure" in the camera 516, and after a fixed period of time an automatic "end exposure" is triggered.

In about the middle of the exposure period (or any other predefined point in time) a latch command 503 is sent to the frame grabber 515 that is attached to the last grabbed frame. The latch command may cause the frame grabber 515 to sample the location data from the encoder 514.

The frame grabber obtains an image 504 from camera 516 and send the image and the location data (denoted image and position 505) to computer 518. Computer 518 may send the location information and the image elsewhere, may perform image processing on the image, may perform a defect detection process, a verification process, a review process, an inspection process and the like.

The system of any one of FIGS. 1, 2 and 4 may perform, for each image out of multiple images the following steps: (1) sending a "start" command to the motion control, this initiates the movement of the wafer. (2) sending a "open shutter" command to the camera to open the shutter, a shutter closing is done automatically, (3) sending a latch command to the frame grabber for taking from the encoder a current position (4) after an automatic shutter close—transferring an image to the frame grabber wherein the current position is attached to the image, and (5) transferring the image and the current position to the computer. The system continuously illuminates the object during the acquisition of the multiple images and between the acquisition of multiple images.

The different triggering signals are sent based on timing constraints related to different operations—the wafer should be moved before the shutter of the camera is opened, the latching should occur before the shutter of the camera is closed, the image should be sent from the camera after the shutter is closed. In addition—the timer is configured to generate the camera triggering signals, motion device triggering signals and motion device location triggering signals in response to timing differences between propagation periods of the camera triggering signals, the motion device triggering signals and the motion device location triggering signals. The motion device triggering signals may trigger a movement along one or more axes.

The continuous free run acquisition concept enables the planner more freedom for optimization of each component of the system as it relaxes its dynamic properties (reaction time, stability etc.). This relaxation allows a stable and durable illumination device such as constant light emitting diodes (LEDs) to be used. The above advantages join the increased performance (full camera rate) and accuracy (direct position measurement) of the system due to the Free Run approach.

Figure 5:
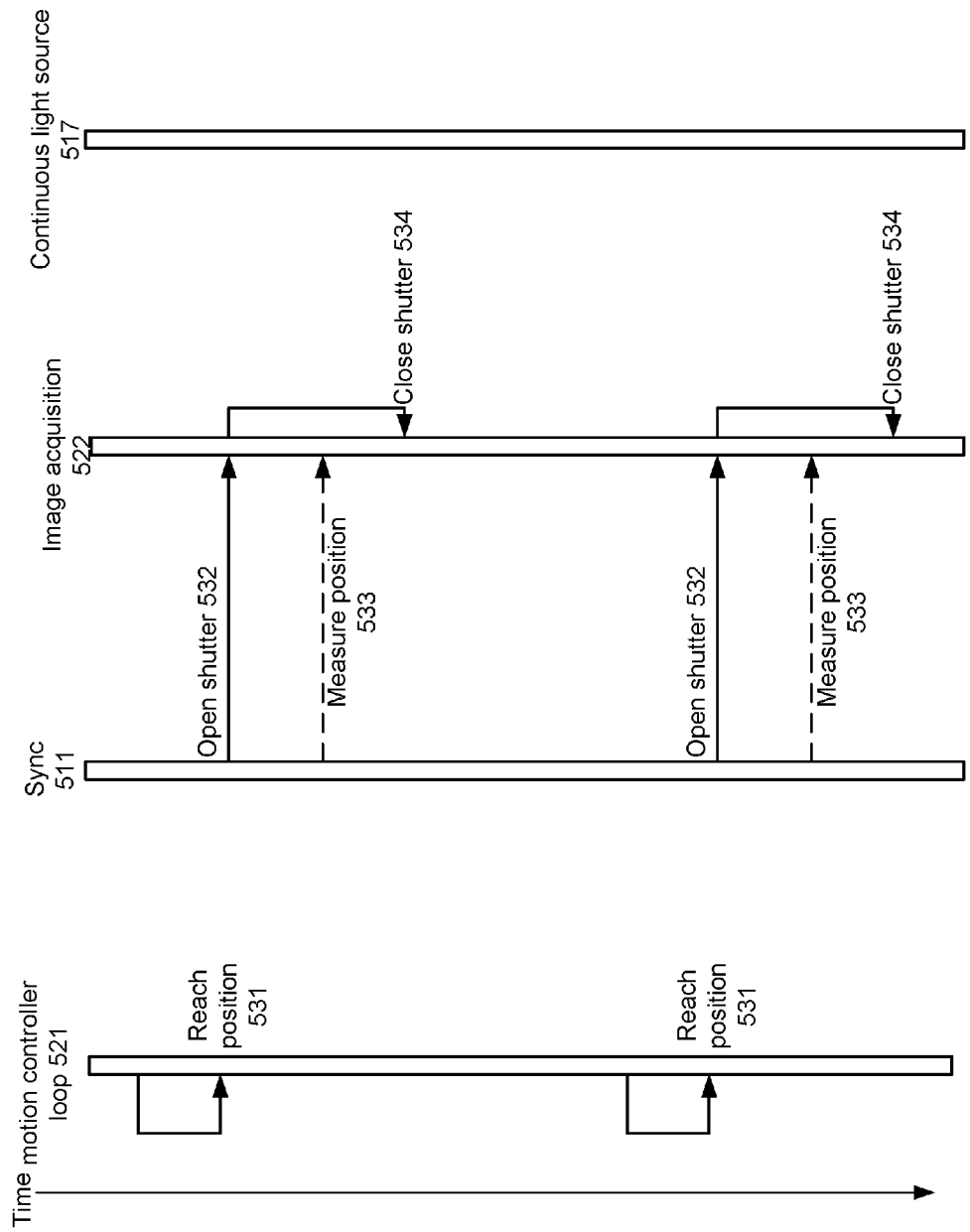
FIG. 5 is a timing diagram according to an embodiment of the invention.
Figure 6:
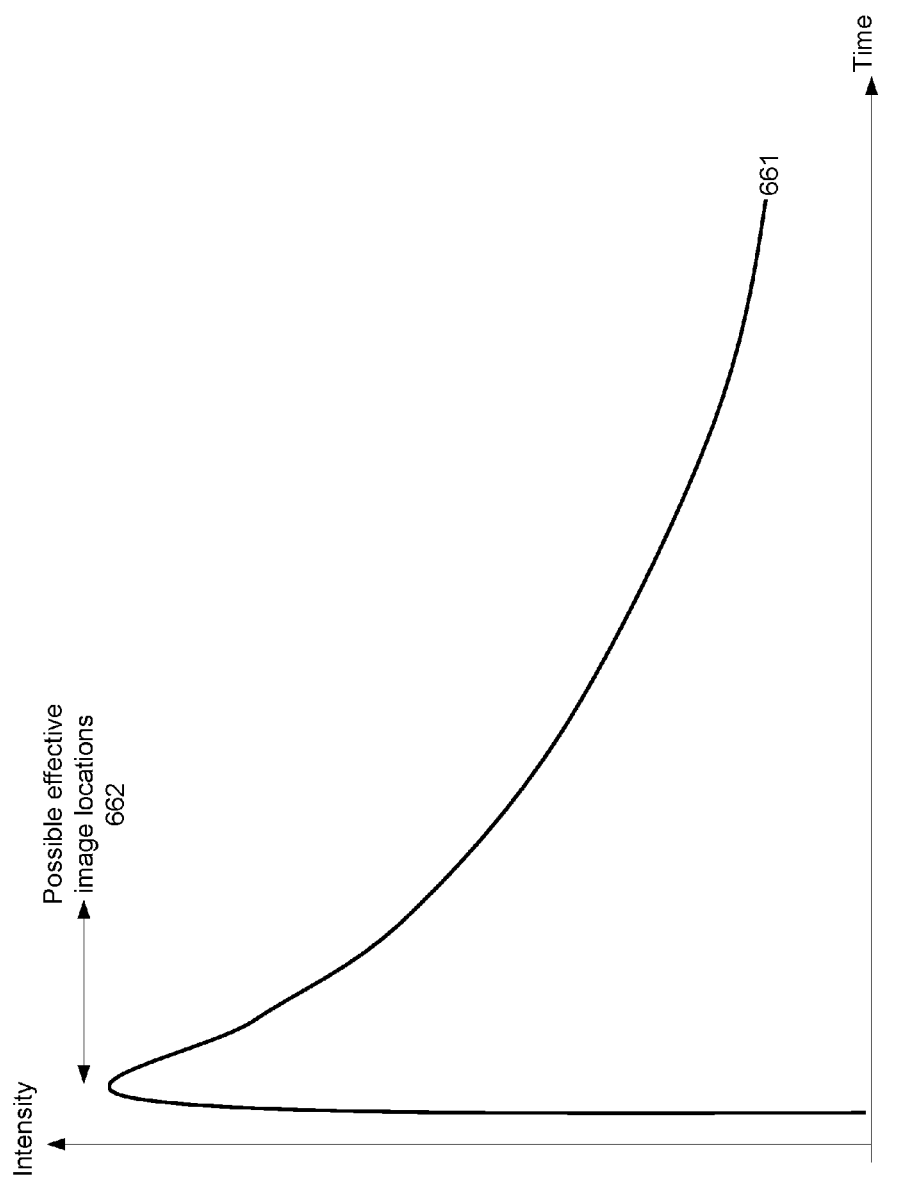
FIG. 6 illustrates a prior art strobe illumination variation.

FIGS. 3 and 5 illustrate the decoupling between the motion control loop 521 (reaching a position 531) and image acquisition module 522.

Timer 511 starts the motion (not shown in FIGS. 3 and 5), and also sends commands to the image acquisition module 522 for opening shutter 532, and measuring position 534, wherein the shutter is closed 534 a predefined period after being opened.

The continuous light source 517 continuously illuminates the object.

According to an embodiment of the invention there may be provided a method for free run continuous scanning.

Camera 516 may be a color camera, a monochromatic camera, a black and white camera and the like.

Figure 8:
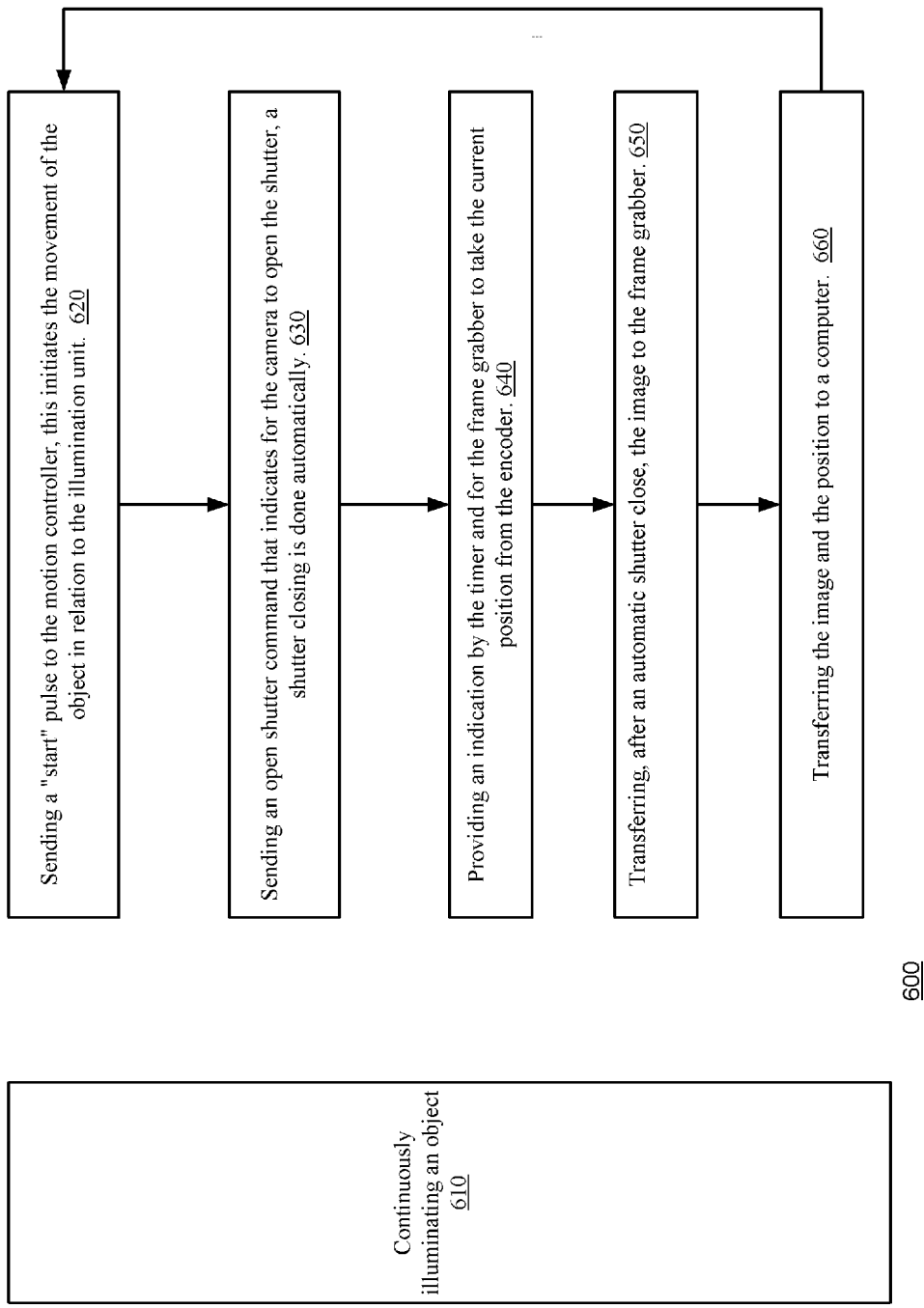
FIG. 8 illustrates a flow chart according to an embodiment of the invention.

FIG. 8 illustrates a method 600 according to an embodiment of the invention.

Method 600 may start by step 610 of continuously illuminating an object. The continuous illumination may be executed during an acquisition period. During an acquisition period multiple images of the object should be obtained.

The acquisition period may be long enough to facilitates the acquisition of images of areas of the object the form entire object—but this is not necessarily so. For example—an acquisition period may stop when the motion device performs a mechanical back scan during which no images may be acquired.

The illumination may include continuously illuminating the entire object or a part of the object that is within the field of view of the illumination unit.

While step 610 is executed method 600 includes repeating the following steps:
  a. Sending (620) a "start" pulse to the motion controller, this initiates the movement of the object in relation to the illumination unit.
  b. Sending (630) An open shutter command that indicates for the camera to open the shutter, a shutter closing is done automatically,
  c. Providing (640) an indication by the timer and for the frame grabber to take the current position from the encoder.
  d. Transferring (650), after an automatic shutter close, the image to the frame grabber.
  e. Transferring (660) the image and the position to a computer.

For example—the illumination unit may include Xe, LED, Halogen, Tungsten, HID (inc. Metal Halide), laser, laser driven plasma source (or any other) operates in continuous mode (a.k.a. CW illumination).

Method 600 may include image processing the images acquired by the camera. The images of the areas may suffer from overlap variations (resulting from the speed variations). The processor may take into account the positioned of the different areas (information obtained from the encoder) and may calculate the overlap variations. These overlap variations may be compensated—taken into account—when combining the images (frames) to provide the image of the object—or to provide an image of a region of the object that is larger than an image (frame). The compensating includes combining pixels that do not overlap—without forming gaps in the "combined" image.

Figure 9:
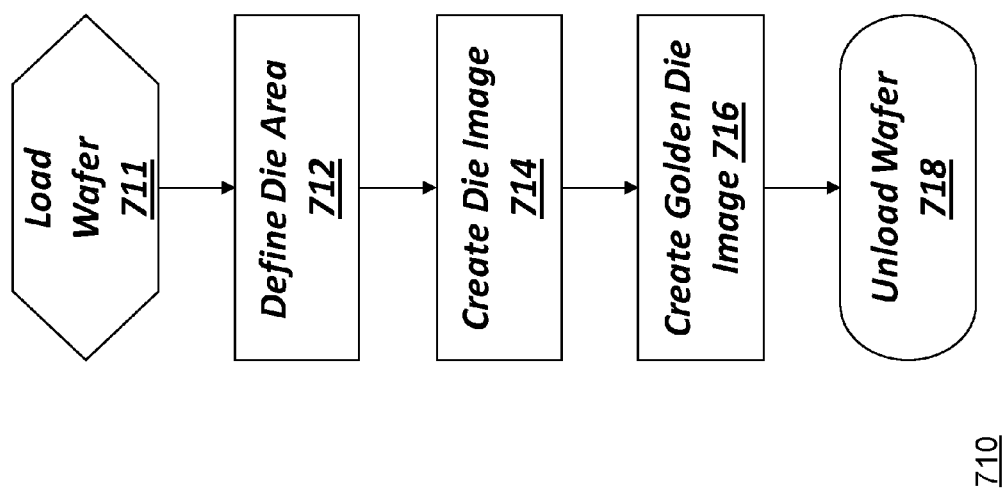
FIG. 9 illustrates a flow chart according to an embodiment of the invention.
Figure 10:
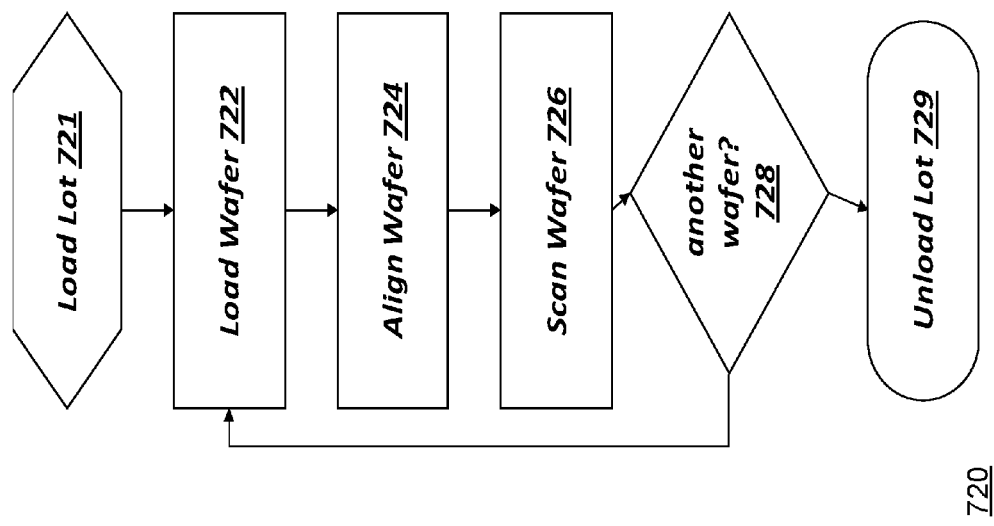
FIG. 10 illustrates a flow chart according to an embodiment of the invention.
Figure 11:
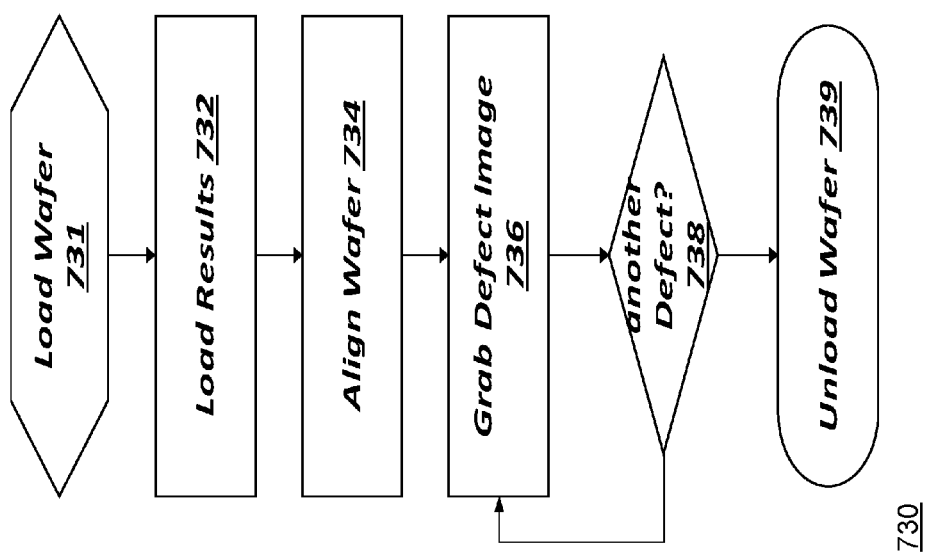
FIG. 11 illustrates a flow chart according to an embodiment of the invention.

FIGS. 9, 10 and 11 illustrate methods 710, 720 and 730 that may be executed using the suggested continuous free run scanning scheme.

Method 710 includes the following sequence of steps: wafer loading 711, defining a die area 712, creating a die image 714, creating a golden die image 716 and unloading the wafer 718.

Regarding method 710—as the die image may be bigger than a frame—a mosaic (including multiple frames that "cover" the die) should be generated and so—accurate location should be attached to the image. This may be easily and accurately obtained using the suggested continuous free run scanning scheme. The die in this sense is an example of a region that is bigger than an area. Each frame covers an area.

Method 720 includes the following sequence of steps: loading a lot of wafers 721, wafer loading 722, aligning a wafer 724, scanning the wafer 726, checking whether another wafer of the lot should be checked (step 728)—if not unloading the lot (729) and is yes—jumping to wafer loading 722.

Regarding method 720—during alignment—an accurate position should be used—while minimizing the stabilization time. Using the suggested continuous free run scanning scheme this can be easily achieved—the inspection system measures the accurate location—and can take the image while the motion controller still corrects the location.

During scan—a full capacity of the system can be used as the effective rate is constant and does not come from the motion controller.

The timing of the image position in a "strobe" is prone to errors as it is a discharge process rather than a digital shutter. Using continuous illumination resolves this problem. The intensity of the illumination may be fixed over time or may be changed but should not be zero during the image acquisition. For example—the illumination can introduce a periodic intensity variation.

Method 730 includes the following sequence of steps: loading a wafer 731, loading results 732 (of a previous inspection session of the wafer), aligning a wafer 734, grab a defect image 736—the location of the defect is listed in the results, checking whether another defect listed in the results should be checked (step 738)—if not unloading the wafer (739) and is yes—jumping to loading results 732.

Regarding method 730—when grabbing offline images the system can reach an approximate location quickly but still have an accurate location.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

However, other modifications, variations, and alternatives are also possible. The specifications and drawings are, accordingly, to be regarded in an illustrative rather than in a restrictive sense.

The word "comprising" does not exclude the presence of other elements or steps then those listed in a claim. It is understood that the terms so used are interchangeable under appropriate circumstances such that the embodiments of the invention described herein are, for example, capable of operation in other orientations than those illustrated or otherwise described herein.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe.

Thus, these terms are not necessarily intended to indicate temporal or other prioritization of such elements. The mere fact that certain measures are recited in mutually different claims does not indicate that a combination of these measures cannot be used to advantage.

We claim:

1. An inspection system, comprising:
    a motion device, for supporting an inspected object and for moving the inspected object, in response to motion device triggering signals, by a movement that is characterized by speed variations; wherein the motion device comprises a stage;
    a signal generator, for generating at a fixed frequency regardless of the speed variations, camera triggering signals, the motion device triggering signals and stage location triggering signals;
    a motion device location generator, for providing location information indicative of locations of the at points of time that are determined by the stage location triggering signals;
    a continuous illuminator for continuously illuminating areas of the inspected object; and
    a camera for acquiring images of areas of the inspected object in response to the camera triggering signals;
    wherein overlaps between the images of the areas of the inspected object are characterized by overlap variations; and wherein the processor is configured to compensate for the overlap variations.

2. The inspection system according to claim 1, wherein the signal generator is configured to generate the camera triggering signals and the motion device location triggering signals at a fixed frequency regardless of the speed variations.

3. The inspection system according to claim 2, wherein the signal generator is configured to generate the camera triggering signals and the motion device location triggering signals at a fixed frequency regardless of the speed variations.

4. The inspection system according to claim 1, wherein the signal generator is configured to generate the camera triggering signals and the motion device triggering signals in response to timing constraints that include timing differences between propagation periods of the camera triggering signals and the motion device triggering signals.

5. The inspection system according to claim 1, wherein the stage is configured to reverse a direction of movement of the inspected object by a gradual change of direction of movement along each axis out of two axes.

6. The inspection system according to claim 1, wherein the motion device is configured to move the inspected object according to a curved pattern.

7. The inspection system according to claim 1, wherein the motion device is configured to move the inspected object without stopping a movement of the inspected object according to a hybrid pattern that comprises linear portions and curved portions.

8. The inspection system according to claim 1 wherein the image processor is configured to generate an image of a region that includes two or more areas of the areas of the inspected object; wherein the generating of the image of the region is responsive to location information indicative of locations of the stage at points of time that are correspond to an acquisitions of images of the two or more areas.

9. The inspection system according to claim 1 wherein the continuous illuminator is configured to continuously illuminating areas of the inspected object with a continuous light beam of a varying intensity.

10. The inspection system according to claim 9 wherein the continuous illuminator is configured to increase an intensity of the continuous light beam before a beginning of an image acquisition period during which the camera acquired an image and to decrease the intensity of the continuous light beam after an end of the image acquisition period.

11. The inspection system according to claim 9 wherein the signal generator is configured to generate at the fixed frequency regardless of the speed variations, continuous illuminator triggering signals; and wherein the continuous illuminator is configured to change the intensity of the continuous light beam in response to the continuous illuminator triggering signals.

12. A method, comprising:
supporting, by a motion device, an inspected object and for moving the inspected object by a movement that is characterized by speed variations; wherein the motion device comprises a stage;
generating, by a signal generator, at a fixed frequency regardless of the speed variations, camera triggering signals, motion device triggering signals and stage location triggering signals;
providing, by a stage location generator, location information indicative of a location of the stage at points of time that are determined by the stage location triggering signals;
continuously illuminating, by a continuous illuminator, illuminating areas of the inspected object; and
acquiring, by a camera, images of areas of the inspected object in response to the camera triggering signals;
wherein overlaps between the images of the areas of the inspected object are characterized by overlap variations; and wherein the method comprises compensating by the image processor for the overlap variations.

13. The method according to claim 12, comprising generating the camera triggering signals and the motion device location triggering signals at a fixed frequency regardless of the speed variations.

14. The method according to claim 13, comprising generating at the fixed frequency the motion device triggering signals.

15. The method according to claim 12, comprising generating the camera triggering signals and the motion device location triggering signals in response to timing constraints that include timing differences between propagation periods of the camera triggering signals and the motion device location triggering signals.

16. The method according to claim 12, comprising reversing, by the motion device, a direction of movement of the inspected object by a gradual change of direction of movement along each axis out of two axes.

17. The method according to claim 12, comprising moving the inspected object according to a curved pattern.

18. The method according to claim 12, comprising moving the inspected object without stopping a movement of the inspected object according to a hybrid pattern that comprises linear portions and curved portions.

19. The method according to claim 12, comprising generating, by the image processor, an image of a region that includes two or more areas of the inspected object; wherein the generating of the image of the region is responsive to location information indicative of locations of the stage at points of time that correspond to an acquisition of images of the two or more areas.

20. The method according to claim 12 comprising continuously illuminating areas of the inspected object with a continuous light beam of a varying intensity.

21. The method according to claim 20 comprising increasing an intensity of the continuous light beam before a beginning of an image acquisition period during which the camera acquired an image and decreasing the intensity of the continuous light beam after an end of the image acquisition period.

22. The method according to claim 20 comprising generating continuous illuminator triggering signals; and changing the intensity of the continuous light beam in response to the continuous illuminator triggering signals.

* * * * *